United States Patent
Hendriks et al.

(10) Patent No.: US 7,499,149 B2
(45) Date of Patent: Mar. 3, 2009

(54) HOLOGRAPHIC MASK FOR LITHOGRAPHIC APPARATUS AND DEVICE MANUFACTURING METHOD

(75) Inventors: Bernardus Hendrikus Wilhelmus Hendriks, Eindhoven (NL); Jan Evert Van Der Werf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 689 days.

(21) Appl. No.: 10/872,775

(22) Filed: Jun. 22, 2004

(65) Prior Publication Data

US 2005/0019675 A1    Jan. 27, 2005

(30) Foreign Application Priority Data

Jun. 24, 2003   (EP) .................................. 03253979

(51) Int. Cl.
*G03B 27/62* (2006.01)
*G03F 1/00* (2006.01)
*G03F 7/00* (2006.01)
*G21K 5/00* (2006.01)

(52) U.S. Cl. .................... 355/75; 430/5; 430/2; 378/35
(58) Field of Classification Search ................ 355/75, 355/65, 53; 430/2, 5; 378/35
See application file for complete search history.

(56) References Cited

U.S. PATENT DOCUMENTS

| 4,537,498 | A | 8/1985 | Banks et al. |
| 5,455,850 | A | 10/1995 | Howells et al. |
| 6,406,820 | B1* | 6/2002 | Ota ............................ 430/30 |
| 2001/0041296 | A1 | 11/2001 | Herr et al. |
| 2002/0030800 | A1 | 3/2002 | Nellissen |
| 2002/0039209 | A1* | 4/2002 | Parker et al. .................. 359/15 |
| 2003/0031938 | A1* | 2/2003 | Singh et al. .................... 430/5 |

FOREIGN PATENT DOCUMENTS

| EP | 1 065 532 A2 | 1/2001 |
| EP | 1 065 568 A2 | 1/2001 |
| JP | 04058244 | 2/1992 |
| JP | 11016809 | 1/1999 |

OTHER PUBLICATIONS

European Search Report dated Dec. 15, 2003 for EP 03253979.3.

\* cited by examiner

*Primary Examiner*—Hung Henry Nguyen
*Assistant Examiner*—Chia-how Michael Liu
(74) *Attorney, Agent, or Firm*—Sterne, Kessler, Goldstein & Fox P.L.L.C

(57) ABSTRACT

A holographic mask includes a plurality of pixels each imparting a calculated phase and/or amplitude change to the projection beam to provide an image that is parallel to the mask. The holographic mask is used displaced from the best object plane of the projection lens.

9 Claims, 2 Drawing Sheets

HOLOGRAPHIC MASK FOR LITHOGRAPHIC APPARATUS AND DEVICE MANUFACTURING METHOD

This application claims priority from European patent application EP 03253979.3, filed Jun. 24, 2003, which is incorporated herein in its entirety.

BACKGROUND OF THE INVENTION

1. Field of the Invention

The present invention relates generally to a lithographic apparatus and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a lithographic process, dust on or defects in the mask that are imaged onto the substrate can cause defects in the manufactured device and so masks are manufactured and stored with great care to avoid damage. Pellicles are conventionally used to prevent dust settling on the mask. A pellicle is a thin transparent sheet mounted on a frame so that it is spaced a few mm from the mask. Any dust particles settle on the pellicle rather than the mask and will be out of focus when the mask is imaged on the substrate so that they are not printed in the resist. For EUV, no material suitable for forming a pellicle is known and masks are based on multi-layer reflectors which are hard to repair so another approach to protecting the mask from dust and damage is required.

SUMMARY OF THE INVENTION

One aspect of embodiments of the present invention provides a lithographic apparatus and a mask, especially for use with EUV radiation, that is less susceptible to imaging defects caused by dust or damage.

According to an aspect of the invention, there is provided a lithographic projection apparatus including an illumination system for providing a projection beam of radiation, a support structure supporting a patterning device, the patterning device serving to pattern the projection beam according to a desired pattern, a substrate table for holding a substrate, a projection system for projecting the patterned beam onto a target portion of the substrate, wherein the patterning device is a holographic patterning device that provides an image that is substantially coincident with a best object plane of the projection system, the best object plane being substantially parallel to said patterning device and the support structure is arranged to position the patterning device in a plane displaced from the best object plane of the projection system.

Because the holographic patterning device is not positioned in the plane of best focus of the projection system, any dust particles or localized damage are not imaged sharply on the substrate and their effect is consequently smeared out over a larger area of the substrate. The smeared effect is unlikely to expose the resist above its threshold so does not appear in the final image. There is a localized loss of contrast, but that can generally be tolerated. Looked at another way, the information in the patterning device relating to a point in the image to be printed is contained in a larger area of the patterning device and so damage to the mask does not obliterate the whole of the information specifying a given point of an image.

Furthermore, because the mask provides an image that is parallel to the mask, the mask can be scanned to enable printing of an image much larger than the image field of the projection system. That is not possible with a grazing incidence mask without tilting the mask relative to the scanning direction, which introduces significant complications.

The patterning device can be embodied as a reflective diffractive optical element, especially for use with EUV radiation.

In one embodiment, the reflective diffractive optical element has a reflective area divided into a plurality of pixels, each pixel applying a predetermined phase shift and/or attenuation to the projection beam thereby to impart said pattern to said beam.

The reflective diffractive optical element can be made by preparing a substrate having a surface contour configured so that differences in the heights of areas corresponding to the pixels of the diffractive optical element effect the necessary phase shifts. A multi-layer stack may be applied to the substrate to improve its reflectivity at the wavelength of said projection beam, especially where the projection beam is EUV. Variable attenuation may be effected by controlling the thickness (number of periods) of the multilayer and/or by applying a layer of an attenuating material of varying thickness.

Alternatively, the diffractive optical element may be formed from a flat substrate, with a multilayer stack to improve reflectivity if desired, by locally applying layers of attenuating and/or phase shifting materials.

The phase shifts and/or attenuations necessary to form the desired pattern can be calculated for a given pattern according to principles elucidated in "Digital Diffractive Optics" by Bernard Kress and Patrick Meyrueis, John Wiley & Sons 2000. ISBN 0 471 98447 7, which document is hereby incorporated by reference.

According to a further aspect of the invention there is provided a device manufacturing method including providing a substrate, providing a projection beam of radiation using an illumination system, using a patterning device to endow the projection beam with a pattern in its cross-section, projecting the patterned beam of radiation onto a target portion of the substrate using a projection system, wherein the patterning device is a holographic patterning device that provides an image substantially coincident with a best object plane of said projection system, the best object plane being substantially parallel to said patterning device and said holographic patterning device is positioned in said projection beam at a location displaced from the best object plane of the projection system, during the projection of the patterned beam of radiation.

Yet a further aspect of the invention provides a holographic mask for use in a lithographic process for the manufacture of devices, said mask comprising a plurality of pixels, each for imparting a predetermined phase change and/or attenuation to a beam of incident radiation, thereby to provide an image that is substantially coincident with a plane that is substantially parallel to said mask.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments

Figure 1:
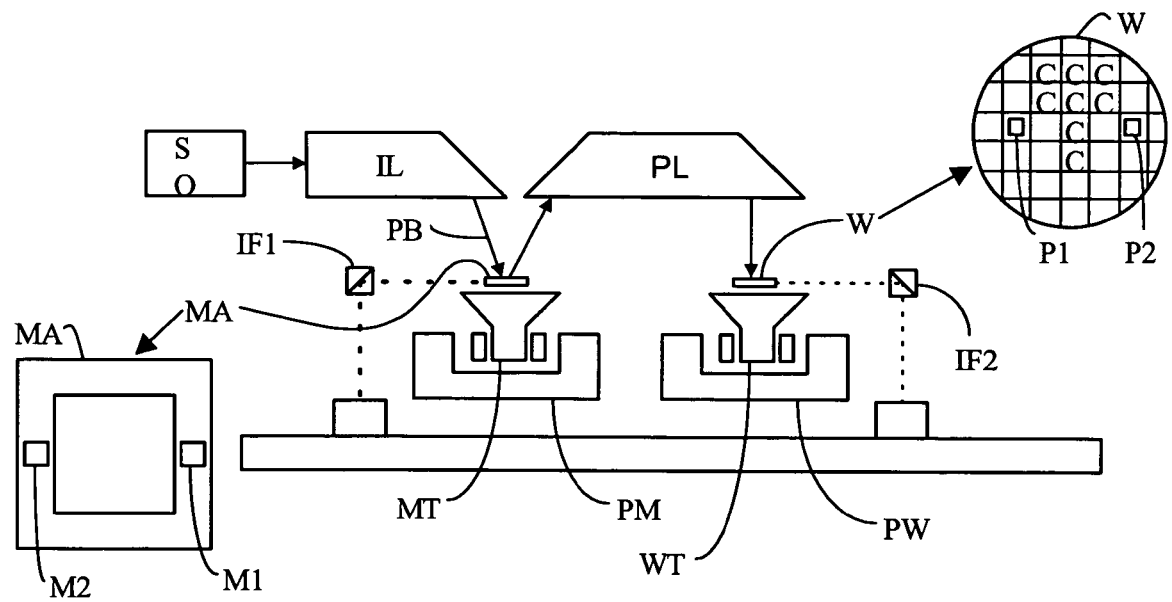
FIG. 1 depicts a lithographic projection apparatus according to a first embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV or EUV radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be an integral part of the apparatus, for example when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
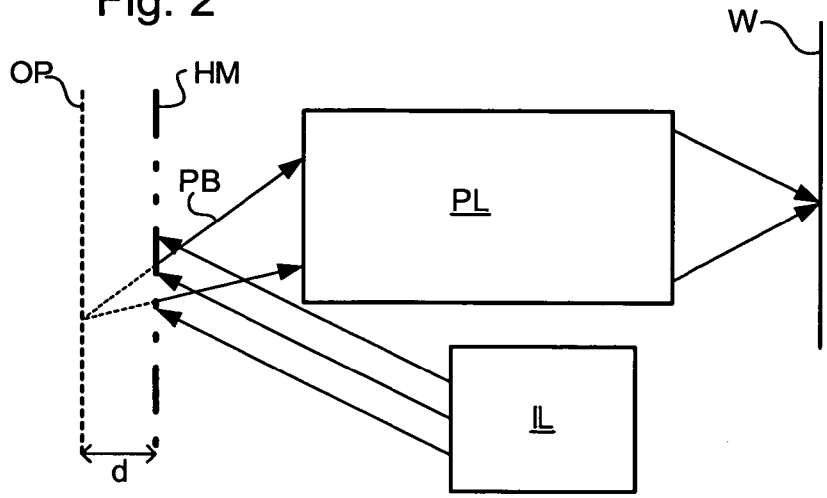
FIG. 2 depicts the position of the holographic mask of the invention relative to the best object plane of the projection system in said first embodiment of the invention.

FIG. 2 shows the optical arrangement of the apparatus. The illumination system IL directs the projection beam onto a holographic mask HM which is spaced a distance d from the best object plane OP of the projection system PL. Although the holographic mask is shown in FIG. 2 as in front of the best object plane it may also be positioned behind the best object plane. Projection system PL is arranged to image the best object plane OP onto the substrate W. The image projected onto the substrate W is determined by the phase shifts and attenuations imparted to the reflected projection beam PB, these are chosen so that the desired pattern is imaged on the substrate. The distance that the holographic mask is displaced from the plane of best focus may be about 10 μm if the numerical aperture of the projection lens is about 0.1.

The necessary phase shifts and attenuations to create a reflective hologram to create an image of a desired pattern can be calculated using known techniques, such as described in "Digital Diffractive Optics" as cited above. See for example chapters 1 and 3 of that book. The holographic mask is divided into a large number of areas (pixels)—each pixel changes the phase and amplitude of the incident radiation in the same way. The required values for the phase and amplitude change (attenuation) in each pixel are calculated by computer simulation. The holographic mask is designed such that it produces an image that is parallel to itself. This enables the mask to be used in a scanning-type lithographic apparatus in the conventional way, with the mask lying parallel to the scanning direction.

Figure 3:
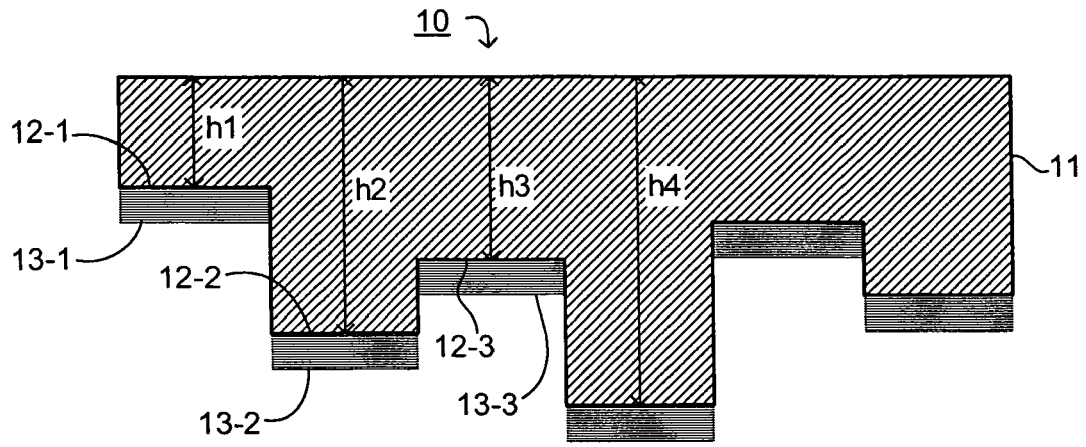
FIG. 3 is a cross-section of a first holographic mask according to the invention.

To fabricate the holographic mask for EUV radiation, two approaches are possible. In the first, illustrated in FIG. 3, a substrate 11 is manufactured with different thicknesses h1 to hn in the areas 12-1 to 12-n corresponding to each pixel. The differences in height between different areas effect the required phase changes. Onto the thus-contoured substrate, multilayer stacks 13-1 to 13-n are deposited to complete the holographic mask 10. The multilayer stacks are optimized to provide the reflectivity for each area to provide the necessary amplitudes in the reflected beams. For EUV, the multilayer stacks may comprise 50 or more periods of Mo/Si or Mo/Be or other materials as disclosed in EP-A-1 065 532 and EP-A-1 065 568, which documents are incorporated herein by reference. These references describe how to manufacture multilayer stacks with maximum reflectivity at the desired wavelength. To produce a stack with a reduced reflectivity it is a simple matter of reducing the number of periods or "detuning" the thicknesses of one or more layers. Additional layers of absorber materials may be incorporated. In general, known techniques for manufacture of EUV masks may be employed for the manufacture of holographic masks of the present invention.

Figure 4:
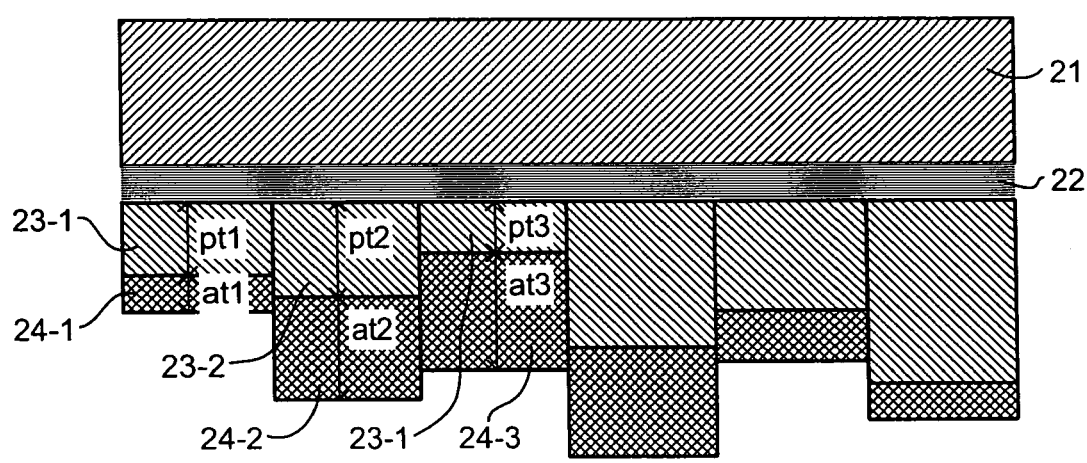
FIG. 4 is a cross-section of a second holographic mask according to the invention.

The second approach to manufacture of a holographic mask is shown in FIG. 4. In this case, the holographic mask 20 is manufactured from a flat substrate 21 on which is deposited a multilayer stack 22 of uniform thickness and optimized for maximum reflectivity at the wavelength of the projection beam with which it is to be used. The flat substrate and multilayer stack are in effect a conventional mask blank. Instead of depositing on the mask blank a binary absorber pattern corresponding to the mask pattern, for the holographic mask of the invention in each pixel a transparent phase layer 23-i and an absorbing phase layer 24-i are deposited. The thicknesses pti and ati of the transparent and absorbing phase layers 23-i, 24-1, are determined to effect the required phase and amplitude changes for each pixel. The transparent layers 23-i are made of a material substantially transparent to the exposure radiation, e.g. Si for EUV, and the absorbing phase layer is made of a material that is substantially absorbing, e.g. Cr for EUV. Inevitably, the transparent layer will absorb some radiation and the absorbing layer will effect a phase change so that the thickness of the two layers should generally be determined together to give the desired effects. It should be noted that in most cases the "transparent" layer is only transparent because it is very thin. The absorbing and transparent phase layers can be applied to the substrate in either order.

In either form of the holographic mask, the pixel size should be as small as possible and in certain cases less than 100 nm to achieve a resolution at substrate level of less than about 50 nm. In total, about 50 phase and amplitude steps are required. The layer thicknesses and substrate height variations can be achieved using lithographic processes to define a resist pattern followed by selective etching or deposition. A large number of cycles will be required to create the holographic mask but these may be carried out using a lithographic projection apparatus having a less good resolution.

Embodiment 2

Figure 5:
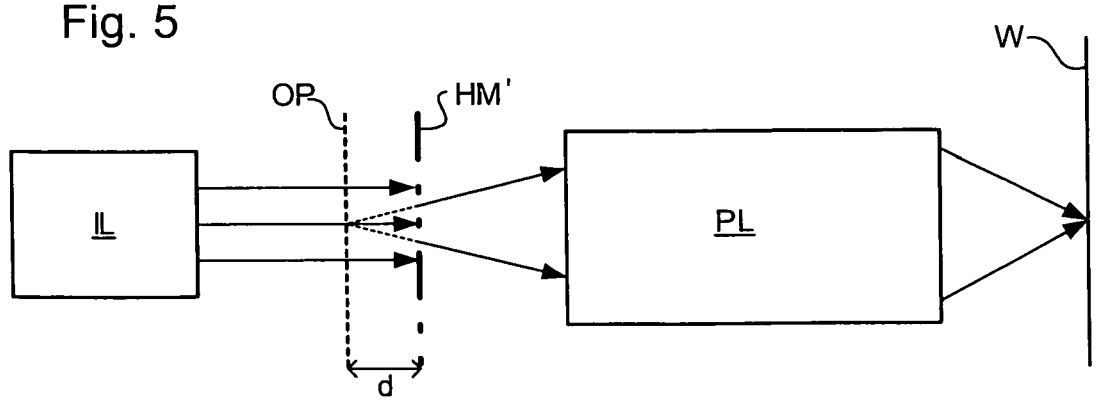
FIG. 5 depicts the position of the holographic mask of the invention relative to the best object plane of the projection system in a second embodiment of the invention.

A second embodiment of the invention is generally the same as the first embodiment except that the holographic mask is transparent rather than reflective and is therefore suitable for use with DUV exposure radiation. The general optical arrangement is shown in FIG. 5.

Illuminator IL illuminates the mask HM' with radiation of suitable coherence length. In traversing the holographic mask HM', which is displaced from the best object plan OP of the projection system PL, the projection beam PB has its phase and amplitude varied in each pixel of the holographic mask as necessary to form the desired image at substrate level. Again, the image formed is parallel to the holographic mask HM' As in the first embodiment, the projection system PL is arranged to project an image of the best object plane OP onto the substrate W.

The holographic mask HM' is similar to the holographic mask HM of the first embodiment but uses a transparent substrate and omits the reflective multilayer (though anti-reflection coatings may be employed). Again, the phase and/or amplitude changes can be effected by varying the thickness of the substrate in each pixel and/or by the addition of absorbing and/or phase shifting layers. Techniques for the manufacture of conventional transparent masks may also be employed.

While specific embodiments of the invention have been described above, it will be appreciated that the invention may be practiced otherwise than as described. For example, the present invention may also be implemented using a programmable patterning device, e.g. using an array of controllable mirrors in which the mirror positions in the Z direction rather than their tilts are controllable or using an array of Pockels cells. The description is not intended to limit the invention.

The invention claimed is:

1. A lithographic projection apparatus comprising:
an illumination system for conditioning a beam of radiation;
a support structure supporting a lithographic patterning device, the patterning device comprising a reflective holographic element and serving to pattern the projection beam according to a desired pattern;
a substrate table for holding a substrate;
a projection system for projecting the patterned beam onto a target portion of the substrate,
the holographic patterning device further being constructed and arranged to provide an image that is substantially coincident with a best object plane of the projection system, and substantially parallel to the patterning device, the projection system being configured to project the image onto the target portion of the substrate, the support structure further being arranged to position the patterning device in a plane displaced from the best object plane of the projection system.

2. Apparatus according to claim 1 wherein the radiation system is adapted to provide a projection beam of radiation having a wavelength in the range of from about 5 nm to about 20 nm.

3. Apparatus according to claim 1 wherein the projection system has a numerical aperture at the side of the patterning device of less than 0.2.

4. Apparatus according to claim 3 wherein the numerical aperture is less than 0.1.

5. A device manufacturing method comprising:
providing a beam of radiation;
patterning the beam with a pattern in a cross-section of the beam;
projecting the patterned beam of radiation onto a target portion of a substrate; and
positioning a holographic patterning device in the beam at a position displaced from a best object plane of an optical system used in the projecting,
wherein the patterning further comprises:
reflecting the beam of radiation; and
holographically providing an image substantially coincident with the best object plane, and
wherein the projecting further comprises projecting the image onto the target portion of the substrate.

6. A method according to claim 5, wherein the patterning further comprises modulating the beam of radiation.

7. A method according to claim 5, further comprising controlling a plurality of picture elements of the holographic patterning device, to impart a predetermined phase change and/or attenuation to the beam of radiation.

8. A lithographic projection apparatus comprising:
an illumination system for conditioning a beam of radiation;
a support structure supporting a lithographic patterning device, the patterning device serving to pattern the projection beam according to a desired pattern;
a substrate table for holding a substrate;

a projection system for projecting the patterned beam onto a target portion of the substrate, the holographic patterning device further being constructed and arranged to provide an image that is substantially coincident with a best object plane of the projection system, and substantially parallel to the patterning device, the projection system being configured to project the image onto the target portion of the substrate, the support structure further being arranged to position the patterning device in a plane displaced from the best object plane of the projection system, and wherein the holographic patterning device is located between the best object plane and the projection system.

9. Apparatus according to claim 8, wherein the best object plane is located between the illumination system and the projection system.

* * * * *